United States Patent [19]

Migita

[11] Patent Number: 5,348,907
[45] Date of Patent: Sep. 20, 1994

[54] METHOD OF FABRICATING OF SEMICONDUCTOR DEVICE BY FORMING TWO ELECTRICALLY INSULATED WELLS OF THE SAME TYPE ELECTROCONDUCTIVITY ON SEMICONDUCTOR SUBSTRATE

[75] Inventor: Takahisa Migita, Tokyo, Japan
[73] Assignee: NEC Corporation, Tokyo, Japan
[21] Appl. No.: 54,335
[22] Filed: Apr. 28, 1993
[30] Foreign Application Priority Data Apr. 28, 1992 [JP] Japan .................................. 4-109415

[51] Int. Cl.5 ...................... H01L 21/70; H01L 27/00
[52] U.S. Cl. ..................................... 437/59; 437/29; 437/40; 437/48; 437/941
[58] Field of Search ........................ 437/43, 45, 47, 52, 437/919, 60, 34, 56, 193, 48, 49, 59, 941, 40, 29; 257/357, 173, 546, 921, 903

[56] References Cited

U.S. PATENT DOCUMENTS 4,621,412 11/1986 Kobayashi et al. ................... 437/34
5,106,769 4/1992 Matsumi ................................ 437/34
5,185,294 2/1993 Lam et al. ........................... 437/193

Primary Examiner—Olik Chaudhuri
Assistant Examiner—H. Jey Tsai

[57] ABSTRACT

A fabrication method of a semiconductor device in which the characteristic deterioration of the device due to electric charges generating in the fabrication process can be prevented. A first well of a first electroconductive type is formed on a semiconductor substrate of the first electroconductive type. The first well is surrounded by a semiconductor layer of a second electroconductive type opposite to the first electroconductive type. A second well of the first electroconductive type, which is insulated from the first well and connected to the substrate, is formed on the substrate. An electroconductive layer for connecting the first and second wells. The electroconductive layer is partially removed to insulate the first and second wells after finishing a process having a possibility for generating electric charges on the substrate.

8 Claims, 3 Drawing Sheets

METHOD OF FABRICATING OF SEMICONDUCTOR DEVICE BY FORMING TWO ELECTRICALLY INSULATED WELLS OF THE SAME TYPE ELECTROCONDUCTIVITY ON SEMICONDUCTOR SUBSTRATE

BACKGROUND OF THE INVENTION

1. Field of the Invention

This invention relates to a fabrication method of a semiconductor device such as a Bi-CMOS-SRAM or the like.

2. Description of the Related Art

A larger capacity, higher speed SRAM (Static Random Access Memory) has been required recently, under such a circumstance, a Bi-CMOS (Bipolar-Complementary Metal Oxide Semiconductor) -SRAM has been attracting strong attention in that it can be provided with both larger capacity and higher speed properties.

In general, as the integration of memory cells of an SRAM is progressed, the capacity of a storage node becomes small, resulting in a reduction in alpha-ray resistivity, which means an increase in possibility of a "soft error". If an alpha-ray is incident to the source and drain regions of the storage node, it penetrates up to a depth of about 30 $\mu$m to generate electron-hole pairs along its locus. The electric charges thus generated are drifted and diffused to be absorbed into the storage node thereby causing the data stored in the storage cells to be destroyed.

To restrain the soft error, conventionally, such a structure that an N$^-$-buried layer is provided between a silicon substrate and an epitaxial layer grown on the substrate has been employed. A conventional fabrication method of a Bi-CMOS-SRAM having the structure will be explained below by referring to FIG. 1, which shows only an N-channel MOSFET of a memory cell thereof.

First, a P-silicon substrate 31 is selectively applied with an ion-implantation of phosphorus at a dose of $1 \times 10^{13}$ to $5 \times 10^{13}$ cm$^{-2}$ and annealed at a temperature as high as 1200° C. to form an N$^-$-buried layer 32 therein. Then, the buried layer 32 is selectively applied on its surface with an ion-implantation of boron at a dose of $5 \times 10^{13}$ to $1 \times 10^{14}$ cm$^{12}$ to obtain a P+-buried buried layer 33. Here, the thickness of the N$^-$-buried layer 32 between the P-silicon substrate 31 and the P+-buried layer 33 is generally about 4 to 5 $\mu$m. And thereafter, an ion-implantation of arsenic is selectively applied to the periphery of the N$^-$-buried layer 32 to form an N+-buried layer 34 which acts as an isolation layer.

Next, an N-epitaxial layer 35 is grown on the surfaces of the P-buried layer 33 and the N+-buried layer 34 and the exposed surfaces of the N$^-$-buried layer 32. Then, a P-well 36 is formed in the epitaxial layer 35 so as to attain the P-buried layer 33. On the surface of the epitaxial layer 35 and that of the P-well 36, a field oxide film 37 for isolation use is formed by the LOCOS (Local Oxidation of Silicon) technique. The field oxide film 37 is disposed just above the N+-buried layer 34.

Subsequently, a gate oxide film 38 with a thickness of 15 to 20 nm is formed on the P-well 36, and a polysilicon gate electrode 39a is formed on the film 38.

Next, an ion-implantation of phosphorus is applied to the P-well 36 at a dose of $5 \times 10^{15}$ cm$^2$ with the gate electrode 39a and the field oxide film 37 as a mask to form a source region 41 and a drain region 42 of the N-channel MOSFET, which are self-aligned with the gate electrode 39a. The state at this time is shown in FIG. 1.

A wiring layer, an interlayer insulation film and a passivation layer (not shown) are formed on the films 37, 38 and the gate electrode 39a by the known methods. Thus, the Bi-CMOS-SRAM in which the storage node is surrounded by the N-type regions 32 and 34 in the substrate 31 is obtained.

In the SRAM, when alpha-ray is incident to the source and drain regions 41 and 42 of the storage node, the alpha-ray generally penetrates up to a depth of about 30 $\mu$m. The electric charges generated by the alpha-ray are absorbed into the lightly-doped N$^-$-buried layer 32 and as a result, the soft error in the memory cell is difficult to occur, which means that the soft error rate can be reduced.

There has been known the fact that in the ion-implantation and plasma etching processes for fabricating the semiconductor device such as the above-described SRAM, electric charges are generated and remain on the surface of the silicon substrate 31. In the case, since the P-well 36 or the storage node is electrically insulated from the N$^-$-buried layer 32, the N+-buried layer and the N-epitaxial layer 35, the electric charges cannot discharge from the substrate 31 and remain on the surface of the substrate 31. The phenomenon has been called "charge up". As a result, the remaining charges are accumulated on the N$^-$-buried layer 32 for restraining the soft error thereby to vary the threshold voltage of the N-channel MOSFET, and in the worst possible case, the gate oxide film 38 is damaged typically, arising a problem that causes the various characteristics of the FET to be deteriorated.

SUMMARY OF THE INVENTION

Thus, an object of this invention is to provide a fabrication method of a semiconductor device in which the characteristic deterioration of the device due to electric charges generating in the fabrication process can be prevented.

The fabrication method of a semiconductor device of this invention comprises the step of forming a first well of a first electroconductive type on one main surface of a semiconductor substrate of the first electroconductive type which is surrounded by a semiconductor layer of a second electroconductive type opposite to the first electroconductive type; the step of forming a second well of the first electroconductive type on the main surface of the substrate which is electrically insulated from the first well and is electrically connected to the substrate; the step of forming an electroconductive layer which connects the first well and the second well to each other on an insulator layer between the first and second wells; and the step of partially removing the electroconductive layer to electrically insulate the first and second well from each other after finishing a process which generates electric charges on the substrate.

With the method of this invention, the first well of the first electroconductive type surrounded by the semiconductor layer of the second electorconductive type is connected through the electroconductive layer to the second well of the first electroconductive type, so that even if electric charges are generated on the first well, the charges can be discharged through the electroconductive layer and the second well to the outside of the substrate.

Since the electroconductive layer is partially removed and the first and second wells are electrically insulated from each other after finishing the process, there arises no problem due to the electroconductive layer.

Accordingly, there arises no problem of the characteristic deterioration of the device fabricated even if the device has a structure for improving the alpha-ray resistivity.

Preferably, a buried layer of the second electroconductive type formed in the substrate and an epitaxial layer of the second electroconductive type formed on the buried layer are provided. And the first well is formed in the epitaxial layer, and the buried layer and the epitaxial layer are connected to each other in the periphery of the first well. The buried layer and the epitaxial layer may be contacted with each other directly or contacted through a semiconductor layer of the first electroconductive type.

The second well is formed in the epitaxial layer and may be contacted with substrate directly or contacted through a semiconductor layer of the first electorconductive type.

Preferably, there are provided the steps of: forming a interlayer insulation layer on the first and second wells; forming a passivation layer on the interlayer insulation layer; and making a hole which extending through the interlayer insulation layer and the passivation layer to the electroconductive layer. And the step of electrically insulating the first and second wells is realized by irradiating a beam such as a laser beam to the electorconductive layer through the hole.

Preferably, the first well is used for an MOSFET constituting a memory cell and the second well is used for the peripheral circuits of the memory. In the case, the electorconductive layer may be connected to the source/drain region of the MOSFET or to the gate electrode thereof.

DESCRIPTION OF THE PREFERRED EMBODIMENTS

Figure 1:
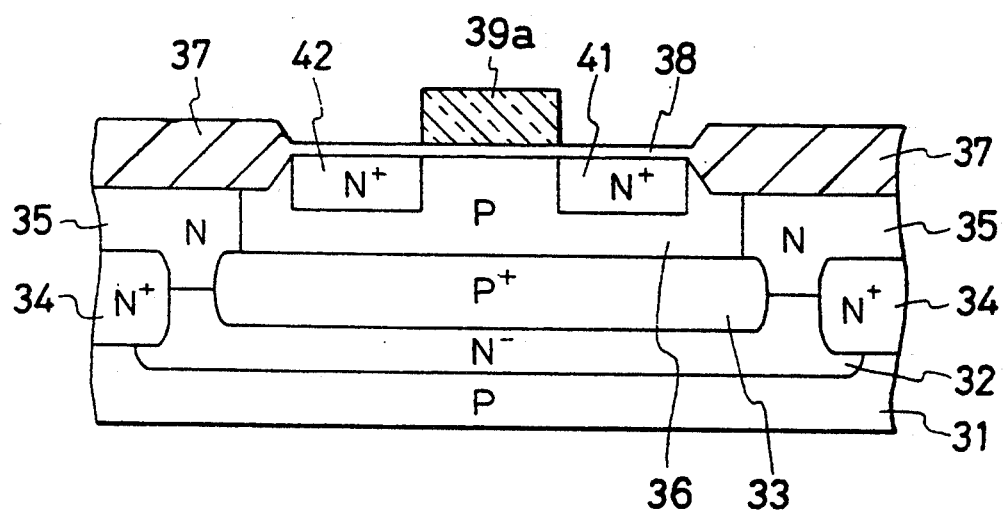
FIG. 1 is a cross-sectional view of a semiconductor device, which shows a conventional fabrication method of the device.

Preferred embodiments of this invention will be described below while referring to the drawings.

First Embodiment

Figure 2A:
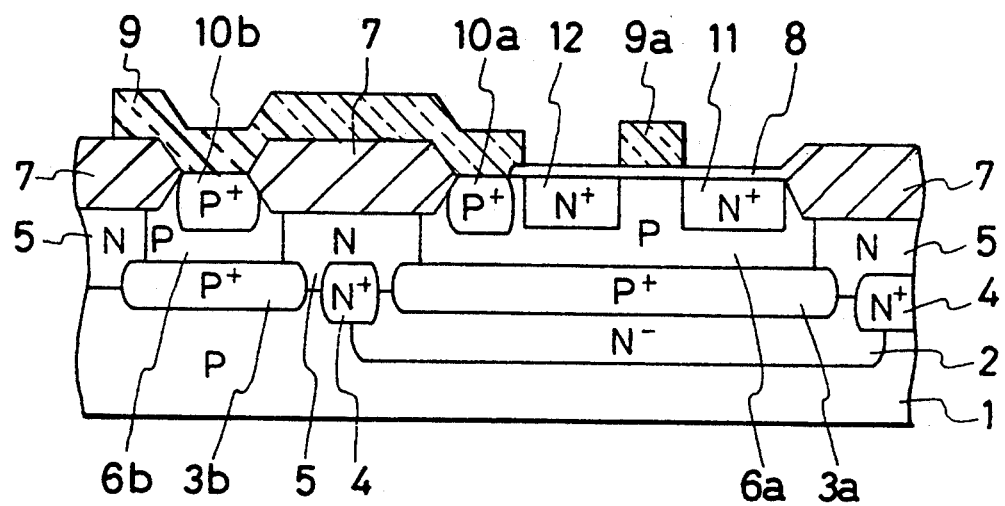
FIGS. 2A and 2B are cross-sectional views showing a fabrication method of a semiconductor device according to a first embodiment of this invention.
Figure 2B:
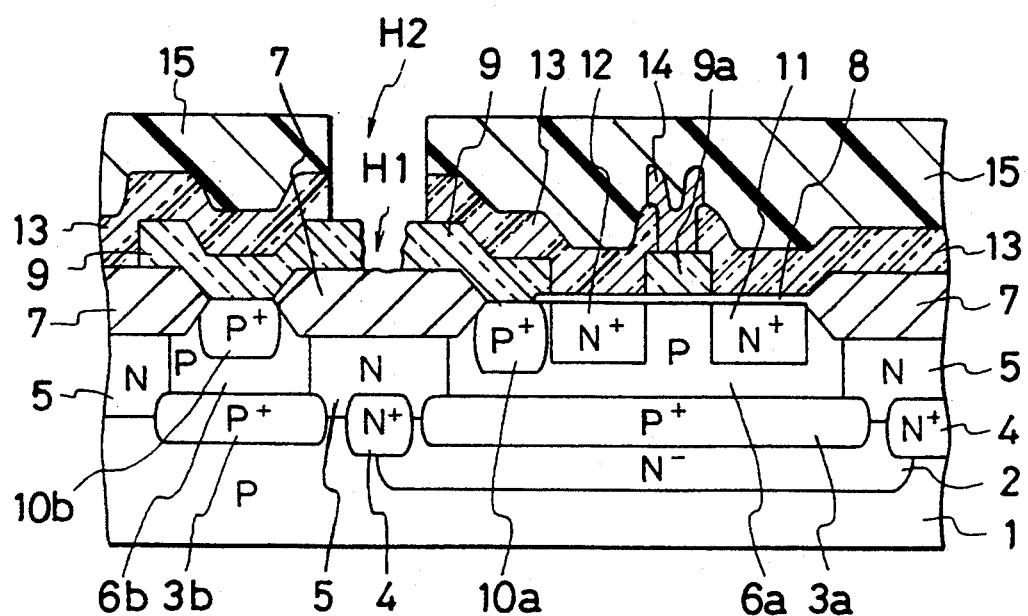

FIGS. 2A and 2B show a fabrication method of a Bi-CMOS-SRAM according to a first embodiment of this invention.

First, as shown in FIG. 2A, a P-silicon substrate 1 is applied with an ion implantation of phosphorus at a dose of $1 \times 10^{13}$ to $5 \times 10^{13}$ cm$^{-2}$ to a range where a memory cell is to be formed and then, annealed at a temperature as high as 1200° C. thereby to form an N$^-$-buried layer 2 for preventing the soft error due to alpha-ray.

Next, the N$^-$-buried layer 2 thus formed and a range where a peripheral circuit is to be formed in the substrate 1 is selectively applied with an ion-implantation of boron at a dose of $5 \times 10^{13}$ to $5 \times 10^{14}$ cm$^{-2}$ and then, annealed to form a P$^+$-buried layers 3a and 3b. The buried layers 3a and 3b are used for electrically insulation of a first P-well and a second P-well which are made in a later process from the substrate 1, respectively.

An ion implantation of arsenic is applied to the boundary of the P-silicon substrate 1 and the N$^-$-buried layer 2 to form an N$^+$-buried layer 4 for device isolation. As a result, the N$^-$-buried layer 2 and the P$^+$-buried layer 3a are surrounded by the N$^+$-buried layer 4.

Next, an N-epitaxial layer 5 is grown on the surfaces of the P$^+$-buried layers 3a and 3b and the N$^+$-buried layer 4 and the exposed surfaces of the substrate 1 and the N$^-$-buried layer 2. Then, ion-implantation is selectively applied to the region for the memory cell and the region for the peripheral circuit to form a first P-well 6a extending from the surface of the epitaxial layer 5 to the surface of the P$^+$-buried layer 3a and a second P-well 6b extending from the surface of the epitaxial layer 5 to the surface of the P$^+$-buried layer 3b.

On the surface of the epitaxial layer 5 and that of the first and second P-wells 6a and 6b, a field oxide film 7 for isolation use is formed by the LOCOS technique. The field oxide film 7 is disposed just above the N$^+$-buried layer 4.

Subsequently, a gate oxide film 8 with a thickness of 15 to 20 nm is formed on the first and second P-wells 6a and 6b and then, the gate oxide film 8 is partially removed in a first P-well 6a and is entirely removed in a second P-well 6b thereby to form contact holes in the film 8, respectively. Then, impurity is diffused in the first and second P-wells 6a and 6b through the contact holes and P$^+$-diffusion regions 10a and 10b are formed.

Polysilicon is deposited on the entire exposed surfaces of the layers and selectively removed by the etching technique. Thus, a polysilicon gate electrode 9a is formed on the gate oxide film 8 and a first polysilicon wiring layer 9 for electrically connecting the first and second P-wells 6a and 6b to each other is formed. As shown in FIG. 2A, the polysilicon wiring layer is deposited on the field oxide film 7 and contacted with the P$^+$-diffusion layers 10a and 10b.

As shown in FIG. 2A, since the first P-well 6a, or the memory cell is surrounded by the N$^-$-buried layer 2, N$^+$-buried layer 4 and N-epitaxial layer 5, the well 6a is electrically insulated from the P-silicon substrate 1. However, the first P-well 6a is electrically connected to the substrate 1 through the P$^+$-diffusion region 10a, the first polysilicon wiring layer 9, P$^+$-diffusion region 10b, the second P-well 6b and the P$^+$-buried layer 3b, and as a result, electric charges generated in an ion-implantation or plasma etching process or the like and remaining on the surface of the first P-well 6a can be discharged to the outside of the substrate 1.

Accordingly, there does not arise such a problem that the electric charges generated on the surface of the silicon substrate 1 are accumulated to vary the threshold voltage of the N-channel MOSFET or to damage the gate oxide film 8 as would be seen in the conventional method.

Next, an ion-implantation of phosphorus is applied to the first P-well 6a at a dose of $1 \times 10^{13}$ cm$^2$ to $5 \times 10^{13}$ cm$^2$ with the gate electrode 9a and the field oxide film 7 as a mask to form a source region 11 and a drain region 12 of the N-channel MOSFET, which are self-aligned with the gate electrode 9a. The state at this time is shown in FIG. 2A.

Next, as shown in FIG. 2B, an interlayer insulation film 13 is formed over the entire substrate 1 and then, a contact hole is formed in the film 13 at a position just above the polysilicon gate electrode 9a. On the film 13, a second polysilicon wiring layer 14 used for the high-resistance load of the SRAM is formed. As a result, the second wiring layer 14 is electrically connected through the contact hole of the interlayer insulation film 13 to the gate electrode 9a.

After forming a passivation layer 15 on the film 13 and the second polysilicon wiring layer 14 over the entire substrate 1, a hole H2 is formed in the passivation layer 15 and the interlayer insulation film 13 at a position where the first polysilicon wiring layer 9 and the field oxide film 7 are laminated with each other. At the same time, similar holes are formed at portions where bonding pads (not shown) are to be provided.

After finishing the predetermined diffusion process or processes, a laser beam or the like is applied to the exposed surface of the first polysilicon wiring layer 9 through the hole H2 to partially fuse and remove the layer 9. By the removed portion H1 of the layer 9 thus formed, the first P-well 6a is electrically insulated from the substrate 1 again. Thus, when alpha-ray is incident to the source and drain regions 11 and 12 of the storage node, the electric charges generated due to the alpha-ray are absorbed into the N$^-$-buried layer 2, so that the alpha-ray resistivity can be improved, resulting in a reduction in the soft error rate.

Consequently, according to the method of this invention, a semiconductor device having an improved alpha-ray resistivity can be fabricated without being affected by the electric charges generated in the fabrication process thereof.

In the embodiment, the first polysilicon wiring layer 9 and the polysilicon gate electrode 9a are formed in the same process, however, they may be formed in separate processes.

Besides, the peripheral circuit is formed in the second P-well 6b, however, the same memory cell as that in the first P-well 6a may be formed. In the case, to make a path for discharging the electric charges generated on the surface of the substrate 1, the word lines or the ground lines of the memory cells are preferably extended to electrically connect to the wells where the peripheral circuits are formed. There is an advantage that a reduced memory cell area can be obtained.

Second Embodiment

Figure 3A:
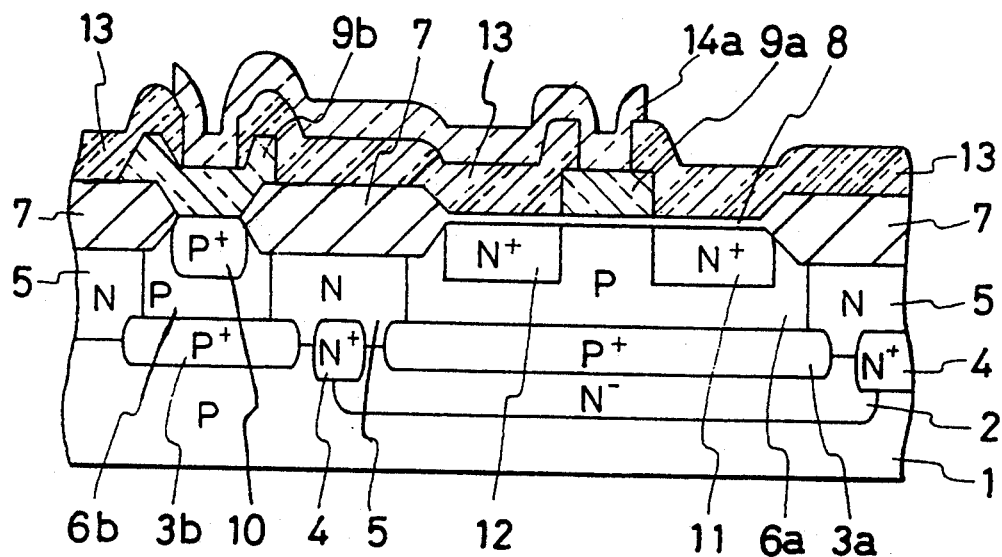
FIGS. 3A and 3B are cross-sectional views showing a fabrication method of a semiconductor device according to a second embodiment of this invention.
Figure 3B:
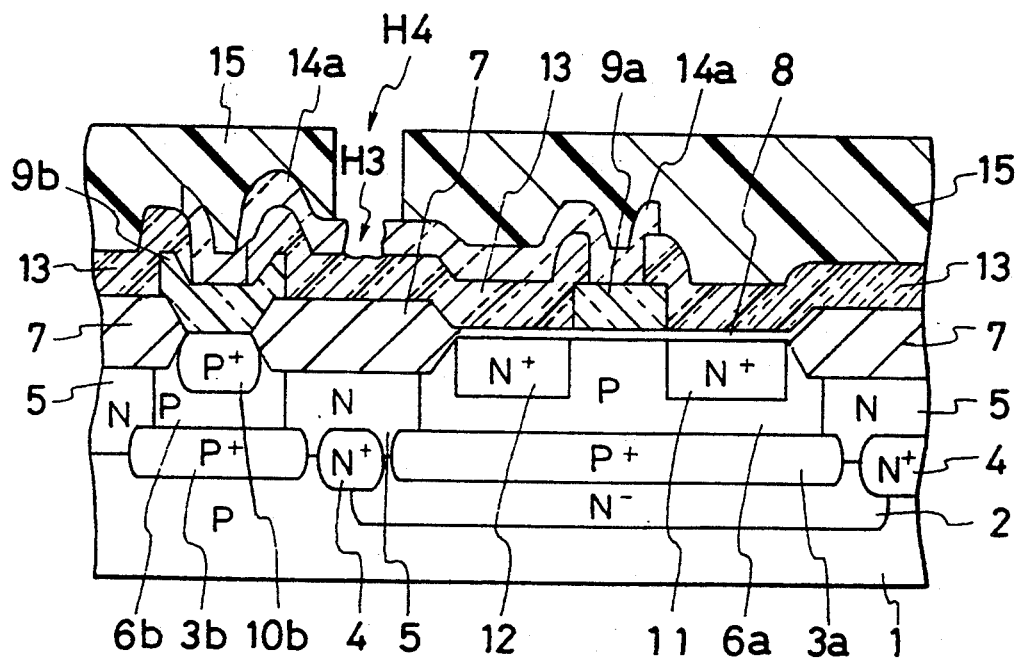

FIGS. 3A and 3B show a fabrication method of a Bi-CMOS-SRAM according to a second embodiment of this invention.

The method of this embodiment is similar to that of the first embodiment other than the layer for connecting the first and second P-wells. That is, in the first embodiment, the first and second P-wells 6a and 6b are electrically connected by the lower first polysilicon wiring layer 9, however, in this embodiment, the P-wells 6a and 6b are connected by an upper second polysilicon layer 14a for a high-resistance load of the memory cell.

As shown in FIG. 3A, the same processes from forming the N$^-$-buried layer 2 to forming the P$^+$-diffusion regions 10a and 10b as in the first embodiment are performed. After forming the P$^+$-diffusion regions 10a and 10b, as shown in FIG. 3A, polysilicon is grown over the entire substrate 1 and the polysilicon film thus obtained is selectively etched to form the gate electrode 9a on the gate oxide film 8 and the first polysilicon wiring layer 9b on the second P-well 6b which is connected to the P$^+$-diffusion layer 10b.

Next, the interlayer insulation film 13 is deposited over the entire substrate 1 and selectively etched to form contact holes at positions just above the polysilicon gate electrode 9a and the second P-well 6b, respectively.

Subsequently, polysilicon is grown over the entire substrate 1 and the polysilicon film thus formed is selectively etched to form the second polysilicon wiring layer 14a. The second polysilicon wiring layer 14a is connected to the first polysilicon wiring layer 9b and the polysilicon gate electrode 9a through the contact holes of the interlayer insulation film 13. Namely, the first P-well 6a electrically insulated from the silicon substrate 1 is electrically connected to the second P-well 6b through the second wiring layer 14a. Accordingly, the electric charges generated on the substrate 1 in the fabrication process can be discharged to the outside of the substrate 1.

After forming a passivation layer 15 on the interlayer insulation film 13 and the second polysilicon wiring layer 14a over the entire substrate 1, a hold H4 is formed in the passivation layer 15 and the film 13 at a position where the second polysilicon wiring layer 14a and the field oxide film 7 are laminated with each other. At the same time, similar holes are formed at portions where bonding pads (not shown) are to be provided.

After finishing the predetermined diffusion process or processes, a laser beam or the like is applied to the exposed surface of the second polysilicon wiring layer 14a through the hole H4 to partially fuse and remove the layer 14a. As shown in FIG. 3B, by the removed portion H3 of the layer 14a thus formed, the first P-well 6a is electrically insulated from the substrate 1 again. Thus, the same effect as in the first embodiment can be obtained.

As described above, the method of this invention makes it possible to solve such a problem as a variation in the threshold voltage of the N-channel MOSFET and a damage to the gate oxide film and the like in the fabrication processes of a semiconductor device.

Consequently, the fabrication yield of the semiconductor integrated circuit devices can be increased, for example, about 10%.

It is to be understood that this invention is not limited to the embodiments except as defined in the appended claims.

This invention can be applied to any semiconductor devices if the P- or N-well formed is provided and is surrounded by a semiconductor layer or layers of the opposite electroconductive type of the substrate.

What is claim is:

1. A fabrication method of a semiconductor device comprising the steps of:

forming a first well of a first electroconductive type on one main surface of a semiconductor substrate of said first electroconductive type which is surrounded by a semiconductor layer of a second electroconductive type opposite to said first electroconductive type;

forming a second well of said first electroconductive type on the main surface of said substrate which is electrically insulated from said first well and is electrically connected to said substrate;

forming an electroconductive layer which connects said first well and said second well to each other on an insulator layer between said first and second wells; and partially removing said electroconductive layer to electrically insulate said first and second well from each other after finishing a process which generates electric charges on the substrate.

2. The method according to claim 1, wherein a buried layer of said second electroconductive type formed in said substrate and an epitaxial layer of said second electroconductive type formed on said buried layer are included, said first well being formed in said epitaxial layer, and said buried layer and said epitaxial layer being connected to each other in the periphery of said first well.

3. The method according to claim 2, and further including the steps of:

forming an interlayer insulation layer of said first and second wells;

forming a passivation layer on said interlayer insulation layer; and making a hole extending through said interlayer insulation layer and said passivation layer to said electroconductive layer; and said step of electrically insulating said first and second wells being realized by applying an irradiating beam to said electroconductive layer through said hole to partially fuse and remove said electroconductive layer at said hole.

4. The method according to claim 3, wherein said first well is used for an MOSFET constituting a memory cell and said second well is used for a peripheral circuit of said memory cell.

5. The method according to claim 4, wherein said electroconductive layer is connected to a source/drain region of said MOSFET.

6. The method according to claim 4, wherein said electroconductive layer is connected to a gate electrode of said MOSFET.

7. The method according to claim 4, wherein said electroconductive layer is connected to one of said first well and second well which is not used as a source/drain region of said MOSFET.

8. A fabrication method of a semiconductor device comprising the steps of:

forming a first well of a first electroconductive type on one main surface of a semiconductor substrate of said first electroconductive type which is surrounded by a semiconductor layer of a second electroconductive type opposite to said first electroconductive type;

forming a second well of said first electroconductive type of the main surface of said substrate which is electrically insulated from said first well and is electrically connected to said substrate;

forming an electroconductive layer which connects said first well and said second well to each other on an insulator layer between said first and second wells; and partially removing said electroconductive layer to electrically insulate said first and second wells from each other after finishing a process which generates electric charges on the substrate;

wherein said first well is used for an MOSFET constituting a memory cell and said second well is used for a peripheral circuit of said memory cell, and said electroconductive layer is connected to a gate electrode of said MOSFET.

* * * * *